United States Patent
Perthold et al.

(10) Patent No.: US 6,314,142 B1
(45) Date of Patent: Nov. 6, 2001

(54) PRE-DISTORTION FOR A NON-LINEAR TRANSMISSION PATH IN THE HIGH FREQUENCY RANGE

(75) Inventors: Rainer Perthold, Erlangen; Heinz Gerhäuser, Waischenfeld, both of (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/202,673
(22) PCT Filed: Jun. 17, 1997
(86) PCT No.: PCT/EP97/03148
  § 371 Date: Oct. 20, 1999
  § 102(e) Date: Oct. 20, 1999
(87) PCT Pub. No.: WO97/49174
  PCT Pub. Date: Dec. 24, 1997

(30) Foreign Application Priority Data

Aug. 2, 1996 (DE) .............................. 196 31 388
Jun. 19, 1999 (DE) .............................. 196 24 447

(51) Int. Cl.[7] .............................. H04K 1/02; H04L 25/03; H04L 25/49
(52) U.S. Cl. .............................. 375/296; 330/149
(58) Field of Search .............................. 375/284, 296, 375/297; 330/149

(56) References Cited

U.S. PATENT DOCUMENTS

| | | | |
|---|---|---|---|
| 4,465,980 | 8/1984 | Huang et al. | 330/149 |
| 5,023,937 | 6/1991 | Opas | 455/126 |
| 5,760,646 * | 6/1998 | Belcher et al. | 330/149 |
| 5,892,397 * | 4/1999 | Belcher et al. | 330/149 |
| 6,029,285 * | 2/2000 | Belcher et al. | 330/149 |
| 6,072,364 * | 6/2000 | Jeckeln et al. | 330/149 |
| 6,141,390 * | 6/1998 | Cova | 375/297 |

FOREIGN PATENT DOCUMENTS

| | | | |
|---|---|---|---|
| 3312030 | 10/1983 | (DE) . | |
| 0 608 697 A1 * | 1/1994 | (EP) | H03F/1/32 |
| 0658975A1 | 6/1995 | (EP) | H03F/1/32 |
| 2240893A | 8/1991 | (GB) | H03F/1/32 |
| WO 93/18581 | 9/1993 | (WO) | H03F/1/32 |

* cited by examiner

Primary Examiner—Stephen Chin
Assistant Examiner—Lenny Jiang
(74) Attorney, Agent, or Firm—Michael A. Glenn

(57) ABSTRACT

A circuit for predistorting a signal to be transmitted via a non-linear channel comprises an envelope detector for detecting an envelope of the signal. A quantization for forming quantized envelope values on the basis of the detected envelope is connected to the envelope detector as well as to a table for supplying complex predistortion coefficients which depend on the quantized envelope values and on a previously detected transmission function of the non-linear channel. An evaluation circuit separated from the non-linear channel and used for the complex evaluation of the signal to be transmitted via the non-linear channel with the complex predistortion coefficients permits the distortion introduced by the non-linear channel to be substantially compensated according to amount and phase.

14 Claims, 2 Drawing Sheets

PRE-DISTORTION FOR A NON-LINEAR TRANSMISSION PATH IN THE HIGH FREQUENCY RANGE

FIELD OF THE INVENTION

The present invention refers to modulation methods resulting in a non-constant envelope of a high-frequency carrier signal, and in particular to the predistortion for a non-linear channel in the high-frequency region.

BACKGROUND OF THE INVENTION

If in an e.g. wireless communication system modulation methods are used, which result in a non-constant envelope of the high-frequency carrier signal, all signal processing components after the modulator must have a sufficient linearity. This demand is difficult to fulfill, especially in power amplifier stages which should operate with high efficiency.

When pulse amplitude modulation methods are used, the spectral efficiency will deteriorate due to the non-linearity of the amplifiers. The reason for this is to be seen in the non-linear amplitude output characteristics of an amplifier, which leads to an AM/AM conversion; the phase drift of an output signal of an amplifier relative to the phase of an input signal produces, in addition, intermodulation components, which is also referred to as AM/PM conversion. The AM/AM and the AM/PM conversion must, however, be prevented by suitable linearization methods. If this is not done, the spectral efficiency of the modulation method used as well as the signal-to-noise ratio will deteriorate. In digital transmission systems this can cause a substantial increase in the bit error rate during the transmission.

Especially in transmission systems making use of a QPSK modulation (QPSK=Quatenary Phase Shift Keying), as is e.g. the case with mobile telephone systems, it is particularly important that the non-linear region of power amplifiers is utilized. In view of the fact that, e.g. in mobile telephones, the available power supply is limited, i.e. a larger storage battery makes the mobile telephone much heavier and much more expensive, the final stage amplifier must operate with the highest possible efficiency, but this is not possible in its linear amplification region. High-efficiency power amplifiers are therefore preferably operated in their non-linear region near saturation, and this causes non-linear distortions entailing the problems described.

Modulation methods requiring a linearization in addition to the PAM modulation, are, fundamentally, all multi-carrier methods (e.g. COFDM for digital broadcasting) and all pulse amplitude modulation methods which comprise, in addition to the QPSK modulation, also the QAM modulation. Further possibilities of use for the predistortion of a non-linear channel exist in the field of base stations of mobile telephone systems when several frequency channels are supplied to a final transmitter stage in parallel.

Hence, there is a need for a suitable linearization method based on predistortion. This method could be used whenever a non-linear channel is to be linearized in general. The linearization of a non-linear channel should additionally permit the frequency region of the input signal into the non-linear channel that is to be equalized to differ from the frequency region of the output signal from the non-linear channel. The linearization must therefore not be limited to mere amplifier stages, but it must also be possible to carry out frequency conversions within the non-linear channel.

DESCRIPTION OF PRIOR ART

A plurality of methods for linearizing high-frequency final stages already exist in the field of technology. The best-known methods of linearizing high-frequency final stages can be classified as follows.

When a signal to be transmitted is digitally predistorted, the digitally represented values of the signal are multiplied by suitably selected coefficients. Hence, the predistortion is carried out together with the digital generation of the control signal of the modulator.

A further known method is the analog predistortion. It makes use of non-linear components, such as Schottky diodes, so as to synthesize an equalizing characteristic which is complementary to the amplifier distortion characteristic.

The "Cartesian loop" represents an analog negative feedback of the high-frequency final stage, which is carried out in the baseband.

The forward coupling (also referred to as "feedforward" in the field of technology) constitutes a disturbance variable feedforward in the sense of control technology, the output signal of the final stage having added thereto a suitable correction voltage for compensating the distortion of the final stage.

Wo 93/18581 describes a "Cartesian loop" whose parameters are adjusted in accordance with various system parameters which are representative of the current operating condition of the system. A radio transmitting unit according to said Wo 93/18581 comprises a power amplifier, a linearization means and a feedback means for feeding a signal back from an output of the power amplifier to the linearization means so as to guarantee the linearity of the output signal. The linearization means operates in the baseband, the IQ signals being controlled by a linear control means which is connected to a direct-access table storing predetermined loop linearization parameters. When the IQ signals have been processed in a suitable manner by the linearization means, these processed signals are subjected to up-conversion by an up-conversion mixer whereupon they are amplified by the power amplifier. The feedback means takes an output signal of the power amplifier, subjects it to down-conversion by means of a down-conversion mixer and feeds the down-converted signal into the linearization means. Hence, the linearization does not take place in the high-frequency region, but in the baseband region, since the signals accessed are the IQ signals. Furthermore, the circuit described realizes a permanent negative feedback of the high-frequency final stage in the sense of a Cartesian loop.

GB 2240893 A discloses a circuit for linearizing the amplitude response and the phase response of an amplifier. An envelope detection circuit detects the envelope of an input signal to be transmitted, the output signal of said envelope detection circuit being inputted in a control circuit of the non-linear type as well as in a phase shift control circuit. The phase shift control circuit controls a phase shifter which precedes the power amplifier for predistorting the high-frequency signal with regard to its phase. The control circuit of the non-linear type feeds an input signal into a variable-voltage dc—dc converter which adjusts the bias voltage parameters, i.e. the operating point of the power amplifier in a suitable manner so as to compensate the distortion of the non-linear amplifier. The amplitude error of the amplifier is therefore compensated for by adjusting the operating point of said amplifier, a course of action which is disadvantageous insofar as the operating point parameters of the amplifier will have to be changed constantly, and this may it make much more difficult to adapt the amplifier to a load, since, normally, a changed operating point will automatically require a different (complex) transformation ratio of the output resistance.

U.S. Pat. No. 5,023,937 represents an analog predistortion circuit for a power amplifier operated in the non-linear region. This predistortion works by means of a negative feedback loop in which, in contrast to the Cartesian loop, not the IQ components of the output signal are controlled, but the amount and the phase of said output signal. An envelope detector detects the amplitude of the signal to be amplified, said amplitude being continuously compared, with regard to its feedback, with the envelope of the output signal of the power amplifier, the comparison result being applied to a variable attenuator which attenuates the input signal before the power amplifier in a suitable manner so as to produce an output signal which is as linear as possible. The phase predistortion is carried out by means of a phase locked loop receiving the signal to be amplified as an input signal. A part of the output signal of the amplifier is also inputted in the phase locked loop by means of a mixer, a local oscillator and a phase shift circuit, said phase locked loop supplying a local osscillator signal for a mixer preceding the power amplifier in order to suitably predistort the phase of the signal to be amplified. This circuit operates in a fully analogous manner and is based on a substantially continuous feedback, if the phase locked loop is locked.

Also U.S. Pat. No. 4,465,980 represents an analog predistortion circuit. A detector detects the envelope of a signal to be amplified and applies this signal to a field effect transistor with two gate terminals ("dual gate FET"). The signal to be amplified is applied to the other gate of the dual gate FET. The high-frequency input signal is suitably predistorted by controlling the operating point of this dual gate FET in a suitable manner so as to compensate the non-linear amplification of a power amplifier connected to the drain terminal of said dual gate FET via a matching network.

DE 3312030 A1 discloses an amplifier with predistortion compensation, which uses predistortion components produced by a power amplifying element, which is similar to the amplifying element, so as to achieve an effective linearization for substantially reducing all intermodulation distortion products. Furthermore, an additional feedback circuit can be provided so as to achieve a further reduction of non-linearities.

EP 312 261 A2 discloses a linearity correction circuit operating in an intermediate frequency region so as to introduce a suitable predistortion in an amplitude envelope for compensating the non-linearity of the power amplifier stages. An array of parallel current sources, each of which is adapted to be adjusted in response to a predistortion over a respective amplitude band, feeds a current which is sufficient for introducing a suitable diferential voltage at the output. In this circuit, a phase predistortion does apparently not take place.

EP 0 658 975 A1 refers to a baseband predistortion system for the adaptive linearization of power amplifiers and to a radio transmitter making use of the predistortion system. In so doing, two error tables, viz, one for the amplitude and one for the phase, are updated, the content of said tables being used for correcting the baseband sampling values. The content of the tables is obtained by accumulating a suitable weighted difference between sampling values which are inputted in the predistortion unit and a demodulated feedback value. It follows that, similar to WO 93/18581, a predistortion is, as described above, not carried out in the high-frequency region, but digitally in the baseband, which necessitates that access to the digital signal processing in the baseband is possible.

A digital predistortion of the type described in EP 0 658 975 A1 and in WO 93/18581 necessitates a possibility of access to the modulation signal before it is converted from a digital representation into an analog voltage value so as to be able to carry out the necessary digital calculations for correcting the carrier amplitude and the carrier phase. This access is not given in many cases, since a linearization is only possible within the closed system of the power amplifier.

The analog predistortion of the high-frequency signal entails the problem that a suitable characteristic must be synthesized from non-linear components which exhibit sample strew, temperature drift, aging etc. Aging of the components can cause an increase in the non-linearity.

The "Cartesian loop", i.e. an HF negative feedback, reacts very sensitively to parameter fluctuations. Due to the high amplification, the whole arrangement has furthermore a strong tendency to oscillate if the feedback parameters are not exactly determined. In addition, the noise response of the final stage is drastically deteriorated by the negative feedback, since said negative feedback, in turn, introduces uncorrelated noise into the amplifier stage.

The "feedforward" method requires an exact determination of the signal propagation times of the final stage. The linearity requirements which have to be fulfilled by the correction signal are high, and this necessitates the use of high-quality, expensive power amplifiers in the case of a circuit carrying out a linearization according to the forward coupling method.

EP 0 608 697 A1 discloses a modulation method and a modulation circuit for high-frequency signals. In the case of this modulation method and modulation circuit, the LF modulation signals, which are modulated upon an HF carrier by means of a complex IQ modulation, are predistorted in the LF region in such a way that tolerances of the HF components of the modulator, i.e. of the 0° to 90° hybrid and of the mixers, which cause imbalances between the I and the Q branch, are compensated for. The predistortion of the LF modulation signals guarantees that e.g. in the case of a single-sideband modulation the carrier and the undesired sideband are sufficiently suppressed.

The technical publication IEE Proceedings: Communications, Vol. 143, No. 2, Apr. 1, 1996, pp. 78–86, Ghaderis M. et al, "Fast Adaptive Polynomial I and Q Predistorter with Global Optimisation", with regard to which the independent claims have been limited, discloses a linearization structure for a high-frequency amplifier, the predistortion being implemented on the intermediate frequency. For this purpose, the envelope of an intermediate frequency signal is detected and quantized in the case of a digital implementation. Furthermore, a lookup table for implementing amplification functions is addressed, an analog implementation being, however, preferred to make things easier. These amplification functions represent the inverse non-linearities of the high-frequency power amplifier whose non-linearities are approximated by means of polynomial functions. An IQ modulator causes a predistortion of the LF signal, the IQ modulation signals depending on the amplification functions and the envelope of the LF signal.

SUMMARY OF THE INVENTION

Starting from this prior art, it is the object of the present invention to provide a circuit for predistorting a signal to be transmitted via a non-linear channel and a method of predistorting such a signal so as to achieve in a flexible and reliable manner an optimum compensation of the distortion introduced by the non-linear channel.

In accordance with a first aspect of the present invention, this object is achieved by a circuit for predistorting a signal to be transmitted via a non-linear channel, comprising: an envelope detector for detecting an envelope of the signal; a quantizer for forming quantized envelope values on the basis of the detected envelope; a table for storing complex predistortion coefficients; and a predistorter separated from said non-linear channel and used for the complex predistortion of the signal with the complex predistortion coefficients in such a way that the distortion introduced by the non-linear channel is substantially compensated according to amount and phase, wherein the complex predistortion coefficients stored in the table depend on a sectionwise linearization of the previously detected non-linear channel, a linearization section having associated therewith a complex predistortion coefficient, and wherein the complex predistortion coefficient supplied by said table to said predistorter is the complex predistortion coefficient that is associated with the linearization section in which a quantized envelope value lies which is supplied to the table.

In accordance with a second aspect of the present invention, this object is achieved by a method of predistorting a signal to be transmitted via a non-linear channel, said method comprising the following steps: detecting an envelope of the signal; forming quantized envelope values on the basis of the detected envelope; storing complex predistortion coefficients in tabular form; and carrying out a complex predistortion of the signal to be transmitted via the non-linear channel with the complex predistortion coefficients in such a way that the distortion introduced by the non-linear channel is substantially compensated according to amount and phase, wherein the complex predistortion coefficients stored in tabular form depend on a sectionwise linearization of the previously detected non-linear channel, a linearization section having associated therewith a complex predistortion coefficient, and wherein the complex predistortion coefficient used in the complex-predistortion step is the complex predistortion coefficient that is associated with the linearization section in which a quantized envelope value lies.

The fundamental problem arising in connection with predistortion is that a realization of a non-linear characteristic has to be found, which can be adjusted with sufficient accuracy and which can be realized by linear components. Since, as has already been stated, it is difficult to simulate a non-linear characteristic e.g. by Schottky diodes, the present invention uses a table means containing predistortion coefficients depending on the amplitude of the input signal as well as on the properties of the non-linear channel which can e.g. be an amplifier or an amplifier-mixer arrangement. The predistortion is carried out by multiplying the input signal with the complex predistortion coefficients. These predistortion coefficients are complex numbers comprising a real part, i.e. an I component, and an imaginary part, i.e. a Q component.

In the equivalent lowpass region, a complex output signal v(t) is therefore produced from a complex input signal v(t) according to the following equation:

$$v(t)=v(t)A(|v(t)|)$$

In this equation A(v(t)) represents the complex amplification which is necessary for correcting the AM/AM and the AM/PM conversion of the non-linear channel. This non-linear function depends essentially on the amplitude of the input signal v(t). The task to be solved now is to linearaize this complex function A in a suitable manner so as to be able to suitably predistort the input signal v(t). The solution of this task is a sectionwise linearization of the complex amplification, a complex predistortion coefficient being obtained for each input signal amplitude in a certain graduation. It follows that the non-linear amplification A is sectionwise linearized, the resolution, i.e. the number of linearizations in a specific amplitude range, depending on the demands as well as on the available storage capacity of the table means. Hence, the sectionwise linearization of the complex amplification A, i.e. the large number of complex predistortion coefficients, permits a practical implementation of the method which allows the predistortion to be carried out directly in the HF region.

The predistortion with sectionwise constant predistortion coefficients is adavantageous especially in cases where access to the digital representation of the signal (in the baseband) is not possible. Furthermore, the predistortion method according to the present invention is insensitive to parameter fluctuations, since all parameter fluctuations can be compensated for by adjusting the predistortion coefficients in a suitable manner.

The noise response of the non-linear channel is not substantially deteriorated, since, in contrast to HF negative feedback, no uncorrelated noise is introduced into the signal path. A further advantage of the present invention in comparison with predistortion methods using a feedback is to be seen in the fact that the non-linear channel is insensitive to feedback oscillations, since no direct feedback path exists.

A point of essential importance with regard to the predistortion method according to the present invention is a precise and efficient determination of the predistortion coefficients contained in the table means. However, these predistortion coefficients need not be constantly determined in real time, but it will suffice to calculate them digitally, e.g. before the circuit is put into operation or at specific calibration times.

The delay time of the predistortion according to the present invention is determined from the outset and does not depend on parameters of any kind, since the predistortion is synchronized by an external clock. Hence, the delay time can be compensated for in a simple and reliable manner.

BRIEF DESCRIPTION OF THE DRAWINGS

In the following, preferred embodiments of the present invention will be explained in more detail making reference to the drawings enclosed, in which.

DETAILED DESCRIPTION OF THE PREFERRED EMBODIMENTS

Figure 1:
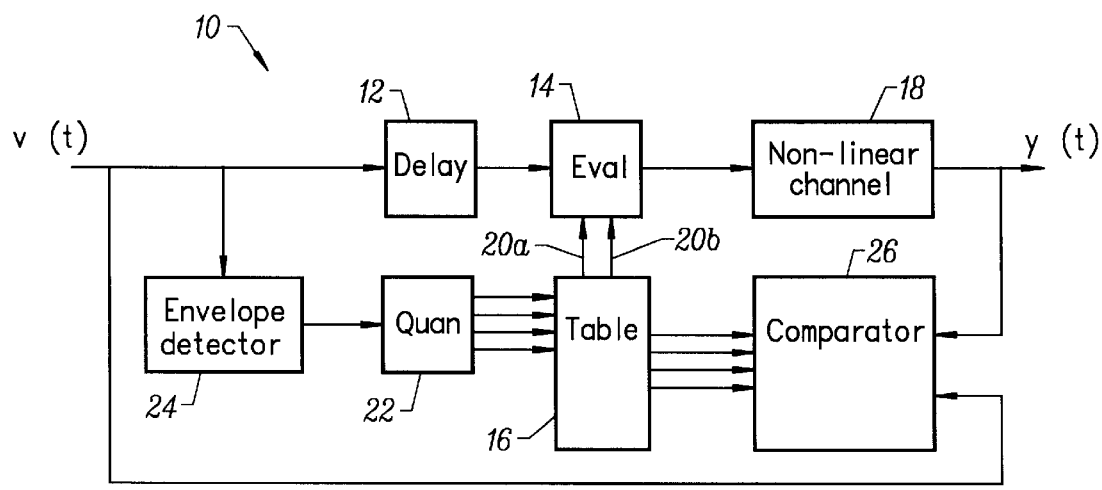
FIG. 1 shows a block diagram of predistortion circuit according to a first embodiment of the present invention.

As can be seen in FIG. 1, an input signal of a predistortion circuit 10 arrives via a delay means 12 at an evaluation means 14 for complex evaluation of the input signal v(t) with complex predistortion coefficients which are stored in a table means 16. The evaluation means 14 can e.g. be a means for the complex multiplication of an input signal, i.e. an IQ modulator.

The evaluation means 14 receives from the table means 16 complex predistortion coefficients depending on the amplitude of the input signal v(t) and on the transmission function of a non-linear channel 18. The real part of a complex predistortion coefficient is inputted into the evaluation means 14 via an I channel 20a, whereas the imaginary part of a predistortion coefficient corresponding to a specific input amplitude is inputted via a Q channel into the complex evaluation means 14.

The table means 16 is addressed by a quantization means 22 which forms quantized envelope values, said values being formed in dependence upon the envelope of the input signal v(t), which is detected by an envelope detector 24. A suitable part of the input signal v(t), which is required for detecting the envelope, can be taken from the main signal path in a manner known to those skilled in the art, e.g. by means of a directional coupler, said main signal path corresponding to the connection from v(t) to y(t) in FIG. 1.

As has already been mentioned, the predistortion coefficients according to the present invention, which are stored in the table means 16 and which are addressed in a suitable manner by the quantization means 22, are calculated and stored when the circuit is not in operation, e.g. when the circuit is being produced or put into operation. In order to be able to carry out a fine adjustment at certain times during the operation of the circuit 10, a comparison means 26 can optionally be provided, which compares the input signal v(t) and the output signal y(t) so as to find out whether a linear relationship, such as a simple amplification, exists between these two signals. If such a linear relationship does not exist, this indicates that ambient conditions have changed and that the predistortion coefficients are therefore no longer adjusted optimally. In a recalibration step, the comparison means 26 now accesses the table means 16 for suitably modifying the predistortion coefficients in accordance with the new ambient conditions.

During operation, a specific fractional part of the input signal v(t) is rectified as linearly as possible by the envelope detector 24, which can, for example, be a diode rectifier, so as to obtain the value of the amplitude of the input signal v(t). This envelope of the input signal is supplied to the quantization means 22 so as to form quantized envelope values on the basis of the envelope detected. These quantized envelope values are used for addressing the table means 16 which contains the complex predistortion coefficients e.g. in a Cartesian representation. In response to addressing of the table means, the complex predistortion coefficient corresponding to a special amplitude of the envelope is supplied to the evaluation means 14 via the I channel and the Q channel according to the real part and the imaginary part, said evaluation means 14 being implemented as a complex IQ modulator and being used for modulating upon the input signal v(t) a predistortion required for obtaining a linearly amplified output signal y(t) of the non-linear channel 18. The linearity of the rectifier is not absolutely necessary as long as its behaviour is known. Insufficiencies can be compensated for in a suitable manner upon determining the complex coefficients in the table. Possible minor non-linearities of the multiplier can be compensated for automatically by an adaptive equalization used by the comparison means 26. The coefficients are modified accordingly.

The signal path via the envelope detector 24, the quantization means 22 and the table means 16 as well as the adjustment of the complex predistortion coefficients have a short delay time in the order of >100 ns. If necessary, this delay time can be compensated for by the delay means 12 preceding the evaluation means 14.

When the non-linear channel 18 is being equalized, the behaviour thereof can be characterized by its transmission function, i.e. the quotient of the distorted output signal and the input signal, according to amount and phase. This transmission function can be obtained in the HF region. A previous frequency conversion into the baseband or to an intermediate frequency is, however, also optionally possible. On the basis of the transmission function of the non-linear channel 18, estimated values for the AM/AM and the AM/PM characteristic of the non-linear channel 18 can then be calculated. The respective predistortion coefficients are then determined on the basis of the measured values and stored in the table means 16 accordingly.

Figure 2:
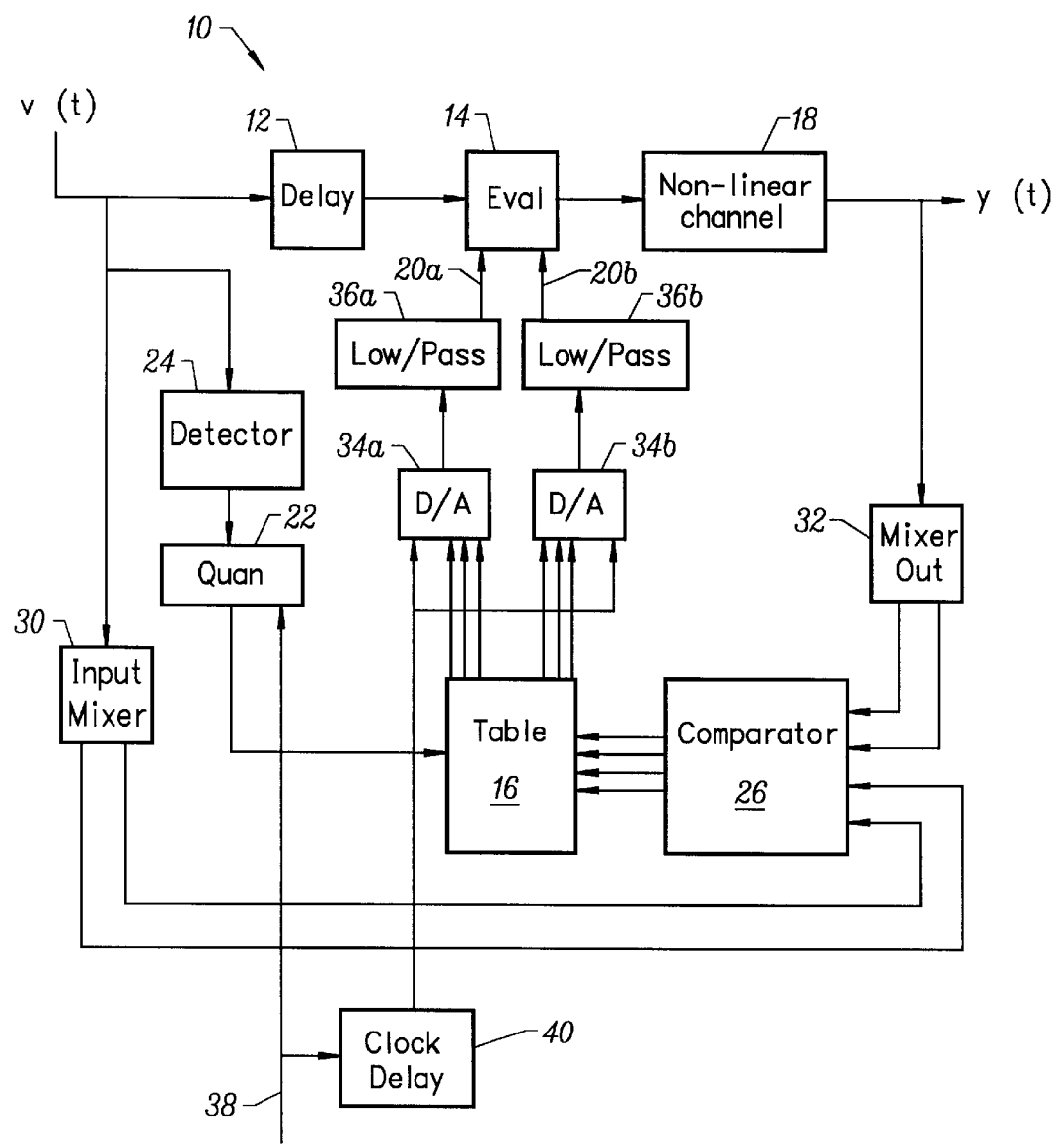
FIG. 2 shows a block diagram of predistortion circuit according to a second embodiment of the present invention.

FIG. 2 shows a second embodiment of the predistortion circuit 10 according to the present invention. Components that are identical in FIG. 1 and FIG. 2 are designated by identical reference numerals. In connection with FIG. 2, only the newly added circuit components will be explained in detail; with regard to the components provided in FIG. 2 and in FIG. 1, the description of said components in connection with FIG. 1 will be referred to.

Other than in the case of FIG. 1, the predistortion circuit 10 according to a second embodiment of the present invention includes an input down-conversion mixer 30 as well as an output down-conversion mixer 32. The two down-conversion mixers 30, 32 supply two values each, which can e.g. be the real part and the imaginary part of the input signal and output signal, respectively, to the comparison means 26, which can be a digital signal processor in the second embodiment of the present invention. Furthermore, the second embodiment comprises between the table means 16 and the evaluation means 14 a combination consisting of a digital-to-analog converter 34a, 34b and of a downstream lowpass 36a, 36b for both the I branch and the Q branch. The lowpass filtering of the I and Q branches serves to effectively suppress subsidiary transmissions into adjacent frequency channels. The quantization means 22, which can, for example, be an analog-to-digital converter, and the digital-to-analog converters 34a, 34b are clocked by a common clock 38, the clock for the digital-to-analog converters 34a, 34b being, however, delayed in a suitable manner in comparison with the clock of the quantization means 22 by a clock delay means 40 so as to take into account the delay of the table means 16. The delay of the clock delay means 40 and the delay of the table means 16 are chosen such that the transit delays of the quantization means 22 and of the table means 16 are smaller than the time delay of the clock delay means 40. The determination of the AM/AM and of the AM/PM characteristic of the non-linear channel, which is implemented as final stage 18 in the second embodiment, takes place via the input signal v(t) demodulated by the input down-conversion mixer 30 and via the output signal y(t) demodulated by the output down-conversion mixer 32.

The second embodiment of the present invention can linearize e.g. the final stage in a main transmitter or in a padding transmitter for digital broadcasting so as to keep the transmissions in the adjacent channels below the demanded limit values and so as to achieve simultaneously a low dissipation of the final stage 18.

Deviating from the embodiments described, it is additionally possible to realize by a single unit the realization of the predistortion by A/D conversion in the quantization means 22, by the table in the table means 16 as well as by the D/A conversion in the two digital-to-analog converters 34a, 34b, said single unit being provided in the form of an integrated circuit. In the case of this realization the digital-toanalog conversion 34a, 34b can be dispensed with, as in the case of the first embodiment, and the circuit integration permits the predistortion to be realized simply by a quantization and a subsequent allocation of an analog output signal which still depends on the analog input signal to a minor extent; this can reduce the necessary resolution for the predistortion coefficients. The integrated circuit is in this case provided with programmable current sources whose values are adaptively adjusted. The advantages of this realization are a higher processing speed and a lower power consumption of the predistortion circuit 10.

In the case of the embodiment shown in FIG. 2, it is furthermore optionally possible to calibrate the envelope detector 24 before the circuit is delivered or after specific calibration intervals. The input signal in the envelope detector 24 is available via the input down-conversion mixer 30, whereas the output signal of the envelope detector is present as a quantized addressing of the table means 16. It is therefore possible to read, if necessary, also the quantized ouput values of the envelope detector 24 into the digital signal processor 26 and to determine the characteristic of the envelope detector, when the predistortion circuit 10 is not in operation, by comparing the two above-mentioned signals. This can be utilized in an advantageous manner for correcting the predistortion coefficients stored in the table means 16.

In most non-linear channels, which can e.g. be power amplifiers, the phase error introduced remains within a quadrant, i.e. between 0° and 90°. In these cases, it will suffice to use instead of the complex IQ modulator, which is a four-quadrant multiplier, an arrangement consisting of a π/2 hybrid, an attenuator for each of the I and Q channels, and a subsequent 0° combiner. In comparison with the complex (passive) IQ multiplier, this evaluation means has the advantage that it can have a higher linearity.

What is claimed is:

1. A circuit for predistorting an analog signal to be transmitted via a non-linear channel, comprising:
    an envelope detector for detecting an envelope of the analog signal;
    a quantizer for forming quantized envelope values on the basis of the detected envelope;
    a table for storing complex predistortion coefficients,
        each complex predistortion coefficient having an in-phase component and a quadrature component,
        the complex predistortion coefficients are stored in the table depending on sectionwise linearization sections of a previously detected relation between an output signal from the non-linear channel and an input signal into the non-linear channel,
        each linearization section having associated there with a complex predistortion coefficient,
        each complex predistortion coefficient stored in said table being addressable by a quantinzed envelope value, each quantinzed envelope value lying in one of the linearization sections,
        the complex predistortion coefficients being determined such that the distortion introduced by the non-linear channel is substantially compensated for according to magnitude and phase; and
    a predistorter separated from said non-linear channel and used for complex predistortion of the signal with the complex predistortion coefficients,
        the predistorter having an I-channel for receiving the in-phase component of the complex predistortion component addressed by an envelope value of the analog signal, and a Q-channel for receiving the quadrature component of the complex predistortion component,
        the predistorter being arranged for IQ-weighting the analog signal using the predistortion coefficient received via the I- and Q-channel.

2. The circuit according to claim 1,
wherein the non-linear channel is a power amplifier and the previously detected relation between an output signal from the non-linear channel and an input signal into the non-linear channel is the power transfer function of the amplifier.

3. The circuit according to claim 1,
wherein the quantinzer is an analog-to-digital converter.

4. The circuit according to claim 1,
wherein the envelope detector is a diode rectifier arrangement.

5. The circuit according to claim 1,
wherein the predistorter is an IQ modulator, and the IQ-weighting is a complex IQ multiplication.

6. The circuit according to claim 1,
wherein the predistorter comprises an arrangement consisting of a π/2 hybrid having an input and an I-output and a Q-output, wherein the analog signal is fed into the input, an in-phase component of the analog signal is obtained at the I-output, and a quadrature component of the analog signal is obtained at the Q-output, two attenuators connected in parallel, one attenuator being connected to the I-output of the π/2 hybrid, the other attenuator being connected to the Q-ouput of the π/2 hybrid, the attenuators being controllable by the predistortion coefficient received via the I-channel and the Q-channel to perform the IQ-weighting, and a 0° combiner having two inputs and one output, one input being connected to the one attenuator, the other input being connected to the other attenuator, and the output delivering a predistorted version of the analog signal.

7. The circuit according to claim 1,
wherein the quantinzer and the table are realized in a single integrated circuit in such a way that programmable sources provided in said integrated circuit are controlled in response to the predistortion coefficients addressed by the quantinzed envelope values so as to supply analog IQ signals to the predistorter.

8. The circuit according to claim 1,
wherein digital-to-analog converters for the I as well as for the Q signal and lowpass filters are arranged between the table and the predistorter for converting digital in-phase and quadrature components of the complex predistortion coefficients stored in the table into analog in-phase and quadrature components to be applied to the I- and Q-channels of the predistorter.

9. The circuit according to claim 8,
wherein the quantinzer and the digital-to-analog converter for the I and Q channels are clocked by the same clock, the clock for the digital-to-analog converter for the I and Q channels being, however, shifted relative to the clock for the quantinzer by a clock delay stage so as to compensate for the delay introduced by the table.

10. The circuit according to claim 1,
wherein the predistorter is preceded by a delay stage as far as signal flow is concerned so as to compensate for the time delay introduced by the path from the quantinzer to the predistorter.

11. The circuit according to claim 1,
wherein a comparator compares the signal to be transmitted via the non-linear channel with an output signal of the non-linear channel and adjusts the predistortion coefficients of the table at predetermined times accordingly.

12. The circuit according to claim 11,
  wherein an input down-conversion mixer converts the signal to be transmitted via the non-linear channel into the base band and an output down-conversion mixer converts the output signal of the non-linear channel into the base band; and
  wherein the comparator is a digital signal processor.

13. The circuit according to claim 12,
  wherein the envelope detector is calibrated by inputting the quantinzed envelope values and the envelope itself into the comparator, whereby the characteristic of the envelope detector is determined so as to connect the predistortion coefficients in the table at predetermined times accordingly.

14. A method of predistorting an analog signal to be transmitted via a non-linear channel, said method comprising the following steps:
  detecting an envelope of the analog signal;
  forming quantinzed envelope values on the basis of the detected envelope;
  storing complex predistortion coefficients in tabular form,
  each complex predistortion coefficient having an in-phase component and a quadrature component,
  the complex predistortion coefficients stored in the tabular form depending on sectionwise linearization sections of a previously detected relation between an output signal from the non-linear channel and an input signal into the non-linear channel,
  each linearization section having associated there with a complex predistortion coefficient,
  each complex predistortion coefficient stored in the tabular form being addressable by a quantinzed envelope value, each quantinzed envelope value lying in one of the linearization sections,
  the complex predistortion coefficients being determined such that the distortion introduced by the non-linear channel is substantially compensated for according to magnitude and phase; and
  carrying out a complex predistortion of the signal to be transmitted via the non-linear channel with the complex predistortion coefficients:
    by receiving the in-phase component of the complex predistortion component addressed by an envelope value of the analog signal,
    by receiving the quadrature component of the complex predistortion component,
    by IQ-weighting the analog signal using the complex predistortion coefficient received.

* * * * *